United States Patent [19]
Nasserbakht

[11] Patent Number: 5,491,431
[45] Date of Patent: Feb. 13, 1996

[54] LOGIC MODULE CORE CELL FOR GATE ARRAYS

[75] Inventor: Mitra Nasserbakht, Dallas, Tex.

[73] Assignee: Texas Instruments Incorporated, Dallas, Tex.

[21] Appl. No.: 318,322

[22] Filed: Oct. 5, 1994

[51] Int. Cl.$^6$ .................................................. H03K 19/173
[52] U.S. Cl. ............................... 326/38; 326/39; 326/37
[58] Field of Search ............................... 326/37–39, 45, 326/50, 113; 327/407, 408, 410

[56] References Cited

U.S. PATENT DOCUMENTS

| | | | |
|---|---|---|---|
| 4,825,105 | 4/1989 | Hozle | 326/37 |
| 4,942,318 | 6/1990 | Kawana | 326/37 |
| 5,198,705 | 3/1993 | Galbraith | 326/37 |
| 5,280,202 | 1/1994 | Chan et al. | 326/37 |
| 5,376,829 | 12/1994 | Rogers | 327/408 |

Primary Examiner—Edward P. Westin
Assistant Examiner—Andrew Sanders
Attorney, Agent, or Firm—John D. Crane; Richard L. Donaldson; William E. Hiller

[57] ABSTRACT

A logic module for use in gate arrays and the like includes five two input multiplexers 50, 52, 54, 56, 58. The module includes 10 data input terminals I1, I2, I3, I4, I5, I6, I7, I8, I9, I10. The first input terminals I1, I2 are connected to the data input terminals of multiplexer 50. Inputs I3, I4 and I5 are connected respectively to the select, the first data and second data inputs to multiplexer 52. Inputs I6, I7 are connected to the data inputs of multiplexer 54. Inputs I8, I9, I10 are connected to the first data, second data and select inputs to multiplexer 56. The output of multiplexer 52 is connected to the select input to multiplexers 50 and 54. The output of multiplexer 56 is connected to the select input to multiplexer 58 while the outputs of multiplexers 50 and 54 are respectively connected to the first and second data input to multiplexer 58. The output of multiplexer 58 comprises the logic circuit output O.

6 Claims, 1 Drawing Sheet 5,491,431

LOGIC MODULE CORE CELL FOR GATE ARRAYS

FIELD OF THE INVENTION

This invention relates to electronic circuits and, more specifically, to any system associated with gate arrays including Application Specific Integrated Circuits (ASIC) and Field Programmable Gate Arrays (FPGA), and particularly to a logic module for use in such a system that achieves improved performance and while minimizing the chip area occupied by the module.

BACKGROUND OF THE INVENTION

Gate Arrays are Integrated Circuits whit the following primary elements:

(1) An array of core cells; and (2) An array of interconnects.

Core cells (also referred to as logic module cells) can implement a variety of logic functions. The selection of a core cell is a key design problem in the development of the gate array architecture. A core cell of a gate array device is characterized among others, by its number of inputs, area, levels of logic required per function, etc. Those characteristics of a logic cell directly affect the frequency and noture of interconnects used which in turn translates to overall performance and area of a given design mapped into a particular gate array.

In the field of gate arrays, designers over the years have spent a great deal of time and effort in designing and analyzing gate array cells. Careful attention has been paid to the size of cells, placement of cells, the number of cells and the like. This effort has been directed to creating a library of cells which are particularly useful in defining a gate array which will have a sufficient number of functions available so as to suit the needs of the circuit designer seeking to use the gate array. It is an additional objective of the gate array designer to be able to provide the functionality desired by logic designers while requiring as few gate array chips as possible.

In the past, designers have attempted to create gate arrays that have logic cells that achieve these objectives. The fact that so many gate arrays have been produced with various logic cells is a testament to this fact and to the fact that designers have not developed a logic cell for gate arrays that is deemed by designers to be clearly better than others. Analysis of logic cells for existing gate arrays demonstrates that they can perform a varying number of functions utilizing a single base logic cell. These cells can then be interconnected with other logic cells of the same or different design to produce other functions. The principal objective of the cell designer, therefore, is to produce the greatest possible functionality per unit area of the chip in a configuration which permits high utilization of the cells on the chip.

Other factors enter into the design of a gate array cell. For instance, cell inputs and outputs are expensive and, accordingly, designers attempt to minimize their number. On the other hand, increasing the number of inputs and outputs permits assembling a cell that operates on a greater number of input data bits thereby dramatically increasing the number of functions that can be performed by each cell. However, if the cell is used by circuit designers for only four input functions, for example, a cell with more inputs and functions may prove to be wasteful. Accordingly, logic cell design is an exercise in balancing conflicting factors.

SUMMARY OF THE INVENTION

In view of the above mentioned and other problems associated with the prior art, it is a principal objective of the present invention to provide a basic logic cell for use in gate arrays that provides high performance and area efficiency as well as high functionality to the design engineer.

It is another objective of this invention to provide a basic logic cell which has a larger number of inputs than preexisting logic cells yet occupies a small physical space on a semiconductor chip.

It is still another objective of this invention to provide a basic logic cell that has a greater number of functions available than prior logic cells.

In achieving these and other objectives of the present invention, the logic cell consists of ten input terminals and five two-input multiplexers. Eight of the terminals are connected to the data inputs of four two-input multiplexers. Two additional input terminals are coupled to the select input of the two-input multiplexers. The output of one of the two-input multiplexers is coupled to the select input of two other two-input multiplexers whose outputs are coupled to the inputs of the fifth two-input multiplexer. The output of one of the two-input multiplexers having its data inputs and select input connected to the input terminals is connected to the select input of the fifth two-input multiplexer. The multiplexers are implemented in CMOS technology and requires only 6 transistors per multiplexer for a total of 30 transistors to create the logic cell.

DETAILED DESCRIPTION

Figure 1:
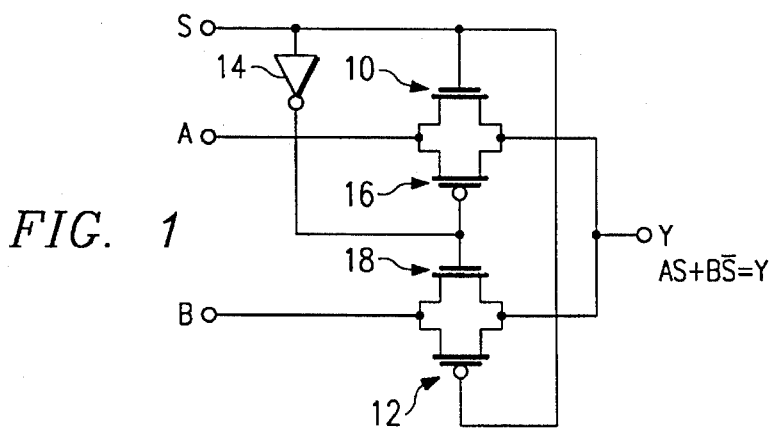
FIG. 1 illustrates a two-input multiplexer which is preferred to be used in the configuration of FIG. 3.

Referring first to FIG. 1, a two input multiplexer is illustrated. This multiplexer has a select input terminal S for receiving an externally generated "select" signal which is utilized by the circuit to determine which of the two data input signals will be passed to the multiplexer output terminal Y. The two data input terminals are labeled A and B.

The select input terminal S is connected to the gate of a N type MOS transistor 10 and the gate of P type MOS transistor 12. The input terminal S is also connected to the input of inverter 14. The output of inverter 14 is connected to the gate of P type MOS transistor 16 and to the gate of N type MOS transistor 18. One of the controlled electrodes of transistor 10 and one of the controlled electrodes of transistor 16 are connected to the input terminal A. The other controlled electrode of transistor 10 and the other controlled electrode of transistor 16 are connected to the output terminal Y. This configuration is referred to as a pass gate configuration between the data input terminal A and the output terminal Y. In a similar fashion, one of the controlled electrodes of transistor 18 and one of the controlled electrodes of transistor 12 are connected to the input terminal A. The other controlled electrode of transistor 18 and the other controlled electrode of transistor 12 are connected to the output terminal Y. Transistors 12 and 18 are also configured in a pass gate configuration between input terminal B and the output terminal Y.

In operation, the circuit of FIG. 1 functions in the following manner. When the level of the "select" line S is high, the gate of transistors 10 and 12 will be high. This will cause transistor 10 to establish a conductive path between input terminal A and output terminal Y. On the other hand, transistor 12 will be non-conductive. At the same time, the inverter 14 causes the voltage on the gates of transistors 16 and 18 to go low. This will cause transistor 16 to establish a conductive path between input terminal A and output terminal Y. Transistor 18 will be non-conductive in this situation. Hence, transistors 10 and 16 act as pass gates allowing the level on input terminal A to pass through to output terminal Y whenever the select signal on input terminal S is high.

When the level of the "select" line S is low, the gate of transistors 10 and 12 will be low. This will cause transistor 12 to establish a conductive path between input terminal B and output terminal Y. On the other hand, transistor 10 will be non-conductive. At the same time, the inverter 14 causes the voltage on the gates of transistors 16 and 18 to go high. This will cause transistor 18 to establish a conductive path between input terminal B and output terminal Y. At this time, transistor 16 will be non-conductive. Hence, transistors 12 and 18 act as pass gates allowing the level on input terminal B to pass through to output terminal Y whenever the level of the select line is low.

Figure 2:
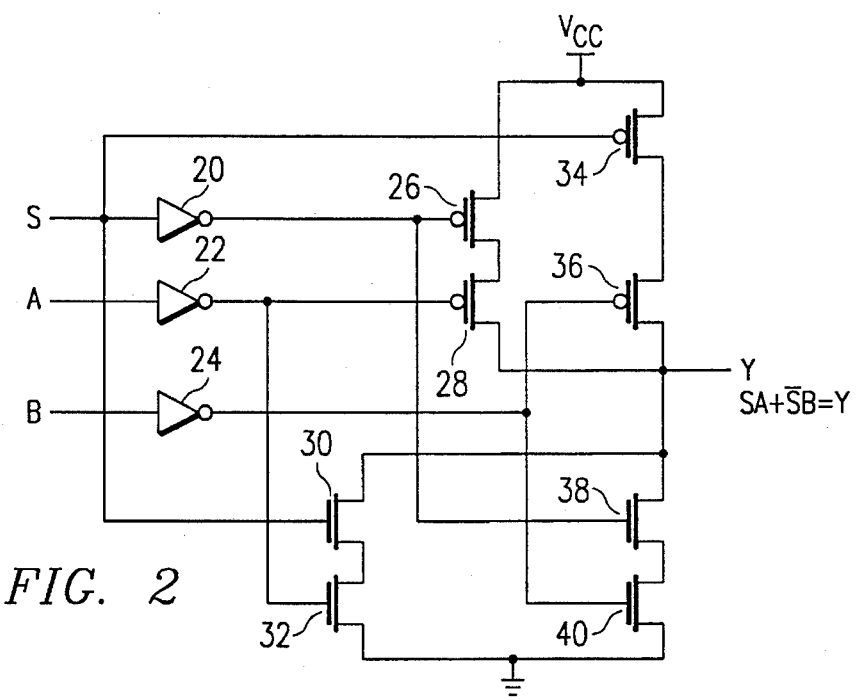
FIG. 2 illustrates an alternative multiplexer which may be utilized in the configuration of FIG. 3

Referring now to FIG. 2, another two input multiplexer circuit is shown. This circuit includes a select input S and two data inputs A and B. It also has an output Y. The circuit of FIG. 2 additionally has three inverters 20, 22 and 24 respectively having their inputs connected to inputs S, A and B. The output of inverter 20 is connected to the gates of P type MOS transistor 26 and N type MOS transistor 38. In addition, input terminal S is connected directly to the gates of P type MOS transistor 34 and N type MOS transistor 30. As such, whenever the signal on the select input line at terminal S is high, transistors 26 and 30 will be conductive and transistors 34 and 38 will be non-conductive. When the signal at input terminal S is low, on the other hand, transistors 34 and 38 are conductive and transistors 26 and 30 will be non-conductive.

The output of the inverter 22 has a signal thereon which is the inverse of that at input terminal A. Whenever the signal at terminal A is low and input terminal S is high, the output of inverter 22 is high. This causes transistor 28 to be non-conductive and transistor 32 to be conductive. As such, a conductive path is established through transistors 30 and 32 to ground thereby pulling the output terminal Y to ground. If, on the other hand, terminal S is high and the inverter 22 output is low, a conductive path is established through transistors 26 and 28 will raise the voltage at terminal Y to $V_{cc}$. Accordingly, whenever the select input is high, the level of the input A is transmitted to the level of the output at Y.

When the level on the input select line S is low, the level of the signal at input terminal B is transmitted to Y. This is accomplished in the following manner. A low at the input terminal S causes transistor 34 to be conductive and transistor 30 to be non-conductive. In a similar fashion, the output of inverter 20 would be high which causes transistor 26 to be non-conductive and transistor 38 to be conductive. Thereafter, when the signal at terminal B is low, the gate of transistor 40 is high which causes transistor 40 to be conductive. As such, a conductive path is established from terminal Y to ground. When the signals at terminal B is high and terminal S is low, transistors 34 and 36 are conductive and transistor 40 is non-conductive. As such, a conductive path is established between output terminal Y and the supply voltage $V_{cc}$.

In view of the above operative description of the circuit in FIG. 2 it is clear that the circuitry of FIG. 2 is functionally equivalent to the operation of the circuit of FIG. 1. Those of skill in the art will recognize, however, that the circuits of FIG. 1 and FIG. 2 represent but two possible circuits for preforming the desired function and that numerous other designs can be utilized as a two input multiplexer.

Figure 3:
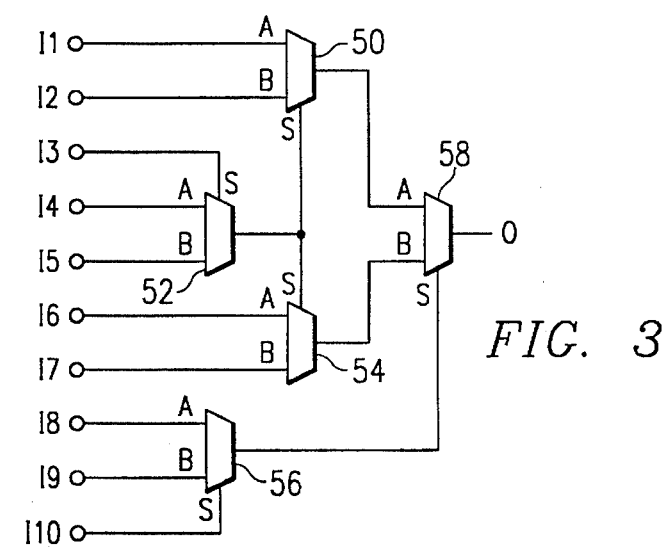
FIG. 3 illustrates the preferred configuration for the logic cell of the present invention.

Referring now to FIG. 3, the preferred embodiment of the present invention is shown and includes five two input multiplexers 50, 52, 54, 56 and 58. Each of these multiplexers may be made as illustrated in either FIG. 1 or FIG. 2 or by an equivalent circuit. The circuit of FIG. 3 has ten (10) input terminals I1, I2, I3, I4, I5, I6, I7, I8, I9, and I10. Input terminal I1 connects to the A input of multiplexer 50. Input terminal I2 is connected to the B input of multiplexer 50. The third input terminal I3 is connected to the select input of multiplexer 54 while the fourth and fifth inputs I4 and I5 are respectively connected to input terminals A and B.

Inputs I6 and I7 are coupled respectively to the A and B inputs to multiplexer 54. The select input S of multiplexer 50 and 54 is connected to the output of multiplexer 52. Inputs I8 and I9 are respectively connected to input terminals A and B of multiplexer 56 while input I10 is connected to the select input S to multiplexer 56. The outputs of multiplexers 50 and 54 are respectively connected to inputs A and B of multiplexer 58. The output of multiplexer 56 is connected to the select input S of multiplexer 58. The output O of the multiplexer 58 comprises the output for the logic module illustrated in FIG. 3.

An important aspect of the present invention is that the select input of some of the multiplexers in FIG. 3 are fed by the output of other multiplexers in the circuit. This, along with other aspects of the present invention as illustrated in FIG. 3 makes the core cell there illustrated superior to prior art core cells due to greatly increased functionality of the cell. Analysis of the logic circuit in FIG. 3 shows that this circuit is capable of producing a very large number of logic functions. For example, the circuit is capable of producing 63 unique 3 input functions. It will produce respectively 1331, 534 and 55 unique 4, 8 and 9 input functions. For functions having 5, 6 and 7 inputs, the total number of such functions which are unique is quite large. Accordingly, the logic circuit of FIG. 3 can be expected to be highly useful in structured logic implementation. This is due to the high functionality and the width of logic functions that can be performed. It also can be shown to implement easily such functions as the 4×1 multiplexer and has a multiplexer driving a multiplexer which is a very powerful function. Despite the functionality of the circuit of FIG. 3, in the implementation utilizing the multiplexer of FIG. 1, the circuit can be implemented with only 30 transistors. As such, the design can be manufactured in a relatively small physical area.

While the above description has been made with particular emphasis on the circuits illustrated in the drawings, those of skill in the art will recognize that the present invention may be made in other ways without departing from the spirit and scope of the present invention. For example, two particular two input multiplexers are illustrated in FIGS. 1 and 2. Those of skill in the art will realize that other multiplexers can be utilized in place of those illustrated in FIGS. 1 and 2 without departing from the spirit and scope of the invention as defined by the following claims.

What is claimed is:

1. A logic module core cell for performing a plurality of logic functions comprising, in combination:

a first, second, third, fourth and fifth multiplexer circuit, each multiplexer circuit with a first and a second data input and a selector input for selecting which said data input is gated to the multiplexer output;

said first multiplexer circuit having its first and second data input comprise a first and second logic module input;

said second multiplexer circuit having its first and second data input and its selector input comprise a third, fourth and fifth logic module input said third multiplexer circuit having its first and second data input comprise a sixth and seventh logic module input;

said fourth multiplexer circuit having its first and second data input and its selector input comprise a eighth, ninth and tenth logic module input;

the output of said second multiplexer circuit being connected to the selector input to said first and third multiplexer; and the output of said first and third multiplexer circuit being connected respectively to said first and second data input to said fifth multiplexer circuit, the output of said fourth multiplexer being connected to the selector input to said fifth multiplexer circuit the output of said fifth multiplexer circuit comprising the output of said logic module.

2. The logic module of claim 1 wherein each multiplexer includes at least two pairs of MOS transistors configured in a pass gate configuration.

3. The logic module of claim 1 wherein each multiplexer includes:

a select input terminal, two data input terminals and an output terminal;

an inverter with its input coupled to said select input terminal and having an inverter output;

a first N type MOS transistor and a first P type MOS transistor configured in a pass gate configuration between one said data input terminal and said output terminal;

a second N type MOS transistor and a second P type MOS transistor configured in a pass gate configuration between the other said data input terminal and said output terminal; and wherein the gate of said first N type MOS transistor and the gate of said second P type MOS transistor is connected to said select input terminal and the gate of said first P type MOS transistor and the gate of said second N type MOS transistor are connected to said inverter output.

4. A logic configuration for performing a plurality of logic functions comprising, in combination:

a first two input multiplexer with a select input, a first and second data input and an output;

a second two input multiplexer with a select input, a first and second data input and an output;

a third two input multiplexer with a select input, a first and second data input and an output;

interconnection means for connecting the output of said second two input multiplexer to said select input to said first two input multiplexer and to said select input to said third two input multiplexer; the inputs to said logic configuration comprising said first and second data input to said first multiplexer, said first and second data input to said third multiplexer, said first and second data input to said second multiplexer and said select input to said second multiplexer; and circuit means connected to the output of said first and said third multiplexer for selecting either said first or said third multiplexer output as the output of the logic configuration.

5. The logic module of claim 4 wherein each multiplexer includes at least two pairs of MOS transistors configured in a pass gate configuration.

6. The logic module of claim 4 wherein each multiplexer includes:

a select input terminal, two data input terminals and an output terminal;

an inverter with its input coupled to said select input terminal and having an inverter output;

a first N type MOS transistor and a first P type MOS transistor configured in a pass gate configuration between one said data input terminal and said output terminal;

a second N type MOS transistor and a second P type MOS transistor configured in a pass gate configuration between the other said data input terminal and said output terminal; and wherein the gate of said first N type MOS transistor and the gate of said second P type MOS transistor is connected to said select input terminal and the gate of said first P type MOS transistor and the gate of said second N type MOS transistor are connected to said inverter output.

\* \* \* \* \*